United States Patent
Suzuki et al.

(10) Patent No.: US 12,152,946 B2
(45) Date of Patent: Nov. 26, 2024

(54) TEMPERATURE DETECTION CIRCUIT

(71) Applicant: Murata Manufacturing Co., Ltd., Kyoto (JP)

(72) Inventors: Nobukazu Suzuki, Kyoto (JP); Hideyo Yamashiro, Kyoto (JP); Yasutaka Sugimoto, Kyoto (JP); Takayuki Kawano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 652 days.

(21) Appl. No.: 17/350,052

(22) Filed: Jun. 17, 2021

(65) Prior Publication Data

US 2021/0310878 A1  Oct. 7, 2021

Related U.S. Application Data

(63) Continuation of application No. PCT/JP2019/049131, filed on Dec. 16, 2019.

(30) Foreign Application Priority Data

Dec. 18, 2018  (JP) .................. 2018-236125

(51) Int. Cl.
*G01K 7/20* (2006.01)
*G01K 7/16* (2006.01)
*G01K 7/42* (2006.01)

(52) U.S. Cl.
CPC .............. *G01K 7/20* (2013.01); *G01K 7/42* (2013.01); *G01K 2007/163* (2013.01)

(58) Field of Classification Search
CPC ...... G01K 7/20; G01K 7/42; G01K 2007/163; G01K 7/01; H03F 2200/451; H03F 3/19; H03F 3/72; H03F 3/50; H03F 3/245
See application file for complete search history.

(56) References Cited

U.S. PATENT DOCUMENTS

| | | | |
|---|---|---|---|
| 3,940,760 A | 2/1976 | Brokaw | |
| 4,123,698 A | 10/1978 | Timko et al. | |
| 6,867,470 B1 | 3/2005 | Lorenz | |
| 2004/0081224 A1* | 4/2004 | Umeyama | ............... G01K 7/01 374/178 |

(Continued)

FOREIGN PATENT DOCUMENTS

| | | |
|---|---|---|
| JP | S51120160 A | 10/1976 |
| JP | S6341013 B2 | 8/1988 |

(Continued)

OTHER PUBLICATIONS

International Search Report issued in Application No. PCT/JP2019/049131, dated Feb. 25, 2020.

(Continued)

*Primary Examiner* — Brandi N Hopkins
*Assistant Examiner* — Janice M Soto
(74) *Attorney, Agent, or Firm* — Pearne & Gordon LLP (57) ABSTRACT

A temperature detection circuit (1) includes a first transistor (Q1) of a bipolar type, and a second transistor (Q2) of a bipolar type, wherein the first transistor (Q1) and the second transistor (Q2) form a current mirror circuit (10), and the temperature of the amplifier circuit (30) is detected based on a temperature change of the first transistor (Q1) and the second transistor (Q2).

16 Claims, 5 Drawing Sheets

(56) References Cited

U.S. PATENT DOCUMENTS

| | | | |
|---|---|---|---|
| 2004/0263247 A1* | 12/2004 | Doherty | ............ H03F 1/30 |
| | | | 330/129 |
| 2007/0152649 A1 | 7/2007 | Liu | |
| 2016/0047696 A1* | 2/2016 | Ramaraju | ............ G01K 7/01 |
| | | | 374/170 |
| 2017/0074921 A1 | 3/2017 | Uota et al. | |

FOREIGN PATENT DOCUMENTS

| | | |
|---|---|---|
| JP | H05336175 A | 12/1993 |
| JP | 2005017139 A | 1/2005 |
| JP | 2009145195 A | 7/2009 |
| JP | 2011238457 A | 11/2011 |
| JP | 2017058146 A | 3/2017 |

OTHER PUBLICATIONS

Written Opinion issued in Application No. PCT/JP2019/049131, dated Feb. 25, 2020.

* cited by examiner

TEMPERATURE DETECTION CIRCUIT

CROSS REFERENCE TO RELATED APPLICATION

This is a continuation of International Application No. PCT/JP2019/049131 filed on Dec. 16, 2019 which claims priority from Japanese Patent Application No. 2018-236125 filed on Dec. 18, 2018. The contents of these applications are incorporated herein by reference in their entireties.

FIELD OF THE DISCLOSURE

The present disclosure relates to a temperature detection circuit that detects the temperature of an amplifier circuit such as power amplifier, low noise amplifier, or the like.

DESCRIPTION OF THE RELATED ART

In general, a power amplifier and a detector circuit, to which part of a transmission signal supplied from the power amplifier is inputted via a directional coupler or the like, are disclosed (for example, Patent Document 1). This enables the detector circuit to output a detection voltage corresponding to a signal inputted to the detector circuit, and thus it becomes possible to detect the power of the transmission signal that corresponds to the size of the detection voltage.
Patent Document 1: Japanese Unexamined Patent Application Publication No. 5-336175

BRIEF SUMMARY OF THE DISCLOSURE

An amplifier circuit is a heat generating component, and in order to ensure the reliability of the amplifier circuit, a demand for the temperature detection of the amplifier circuit is high. However, in the configuration disclosed in the foregoing Patent Document, although it is possible to output a voltage corresponding to the power of a transmission signal (that is to say, power detection), it is not possible to detect the temperature of an amplifier circuit.

Accordingly, an object of the present disclosure is to provide a temperature detection circuit capable of detecting the temperature of an amplifier circuit.

In order to achieve the foregoing object, a temperature detection circuit according to one aspect of the present disclosure is a temperature detection circuit for detecting a temperature of an amplifier circuit, including a first transistor of a bipolar type and a second transistor of a bipolar type, wherein the first transistor and the second transistor form a current mirror circuit, and the temperature of the amplifier circuit is detected based on a temperature change of the first transistor and the second transistor.

In order to achieve the foregoing object, a temperature detection circuit according to one aspect of the present disclosure is a temperature detection circuit for detecting a temperature of an amplifier circuit, including a first transistor of a bipolar type and a second transistor of a bipolar type, wherein the first transistor and the second transistor form a current mirror circuit, and an emitter terminal of one of the first transistor and the second transistor is connected to ground with a resistor interposed therebetween, and an emitter terminal of another of the first transistor and the second transistor is connected to the ground with no resistor interposed therebetween.

The present disclosure enables the detection of the temperature of an amplifier circuit.

DETAILED DESCRIPTION OF THE DISCLOSURE

Hereinafter, embodiments of the present disclosure will be described in detail with reference to the drawings. Note that the embodiments which will be described below each illustrate a comprehensive or specific example. Numeric values, shapes, materials, constituent elements, arrangements and connection modes of the constituent elements, and the like illustrated in the following embodiments are mere examples, and not intended to limit the present disclosure. Of constituent elements in the following embodiments, the constituent elements that are not described in an independent claim will be described as optional constituent elements. Further, sizes or ratios of the sizes of constituent elements illustrated in the drawings are not necessarily exact ones. The same reference codes are attached to substantially the same constituent elements throughout the drawings, and overlapping descriptions therefor are omitted or simplified in some cases. Further, in circuit diagrams and the like which will be described below, in some cases, no reference codes are attached to constituent elements (resistors and the like) that are not closely related to features of the present disclosure, and descriptions regarding such constituent elements are omitted.

Embodiments

Hereinafter, a temperature detection circuit according to an embodiment is described with reference to FIG. 1 to FIG. 7B.

First, an exemplary application of a temperature detection circuit according to the embodiment is described.

Figure 1:
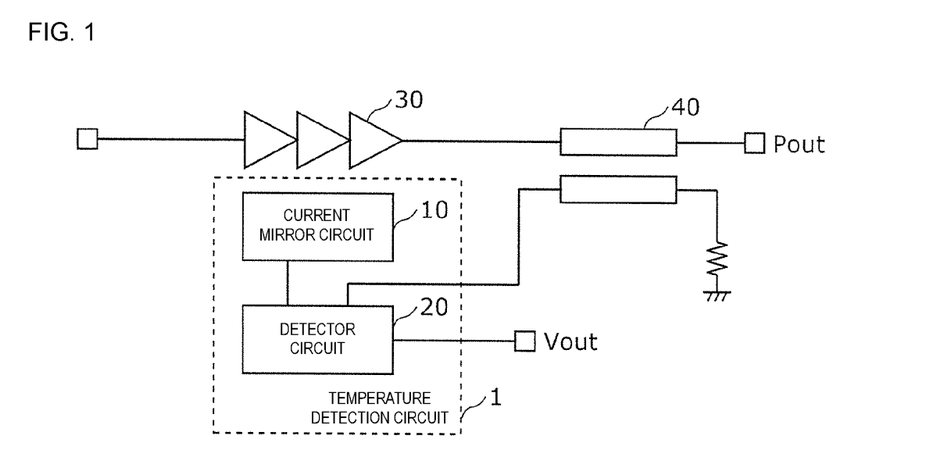
FIG. 1 is a configuration diagram illustrating an exemplary application of a temperature detection circuit according to an embodiment.

FIG. 1 is a configuration diagram illustrating an exemplary application of a temperature detection circuit 1 according to the embodiment.

For example, the temperature detection circuit 1 is used for detecting the temperature of an amplifier circuit 30 that amplifies power. The amplifier circuit 30 is, for example, a power amplifier that amplifies a transmission signal to be sent to an antenna or the like from a radio frequency signal processing circuit or the like. Note that amplifier circuit 30 may alternatively be a low noise amplifier that amplifies a reception signal received by an antenna or the like. In the following description, it is assumed that the amplifier circuit 30 is a power amplifier and a signal outputted from the amplifier circuit 30 is a transmission signal. Alternatively, in the case where the amplifier circuit 30 is assumed as a low noise amplifier, the signal outputted from the amplifier circuit 30 will be a reception signal.

The temperature detection circuit 1 includes a current mirror circuit 10 and a detector circuit 20 and detects the temperature of the amplifier circuit 30 using the current mirror circuit 10. For example, the detector circuit 20 and the amplifier circuit 30 are formed in the same chip, and the distance between the current mirror circuit 10 and the amplifier circuit 30 is smaller than the distance between the detector circuit 20 and the amplifier circuit 30. That is to say, that the distance between the current mirror circuit 10 and the amplifier circuit 30 is smaller than the distance between the detector circuit 20 and the amplifier circuit 30, which are formed in the same chip, means that the current mirror circuit 10 is arranged closer to the amplifier circuit 30 for the detection of the temperature of the amplifier circuit 30. This enables to transmit the temperature of the amplifier circuit 30 that is a heat generating source to the current mirror circuit 10 effectively and enables to detect the temperature of the amplifier circuit 30 more accurately. Note that the current mirror circuit 10 may alternatively be formed in the same chip where the detector circuit 20 and the amplifier circuit 30 are formed.

Further, the temperature detection circuit 1 may alternatively be able to detect not only the temperature of the amplifier circuit 30 but also the power of a transmission signal outputted from the amplifier circuit 30. For example, the temperature detection circuit 1 detects the power of a transmission signal using part of this transmission signal acquired by a directional coupler 40. The use of the directional coupler 40 enables the detection of power while suppressing the loss of power of the transmission signal. For example, the detector circuit 20 may be used not only for detecting the temperature of the amplifier circuit 30 but also for detecting the power of a transmission signal outputted from the amplifier circuit 30. An output voltage outputted from a terminal Vout corresponds to the temperature of the amplifier circuit 30 or the output power outputted from a terminal Pout, and by measuring the output voltage, the temperature of the amplifier circuit 30 or the power of a transmission signal can be detected. The details of the temperature detection circuit 1 are described using FIG. 2.

Figure 2:
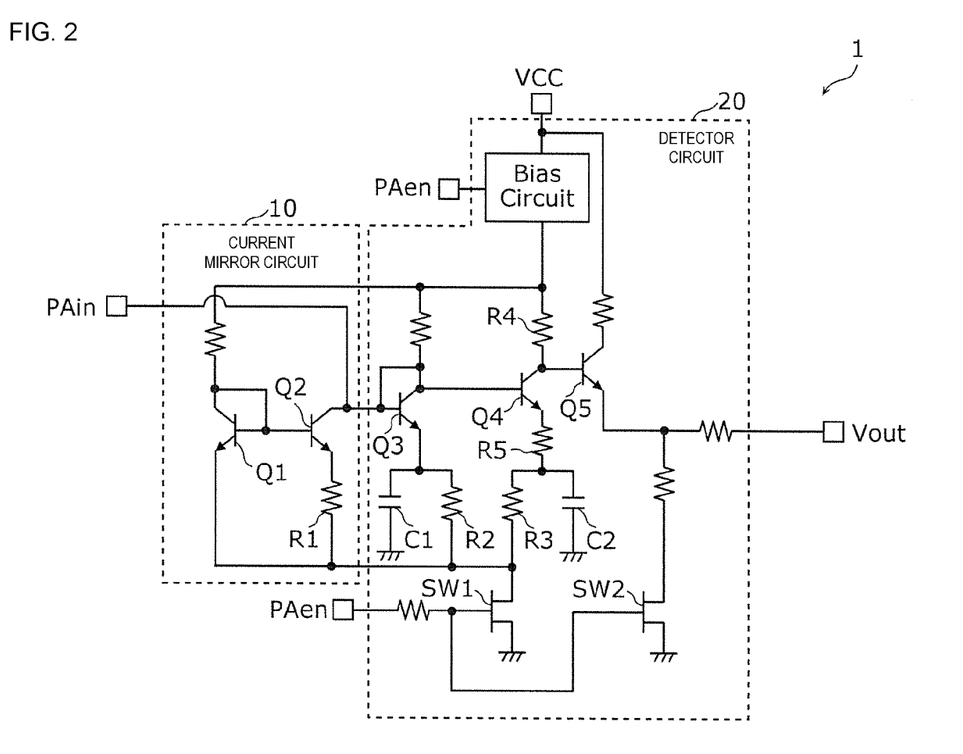
FIG. 2 is a circuit configuration diagram illustrating an example of a temperature detection circuit according to an embodiment.

FIG. 2 is a circuit configuration diagram illustrating an example of the temperature detection circuit 1 according to the embodiment. The amplifier circuit 30 and the directional coupler 40 may not need to be constituent elements of the temperature detection circuit 1, and in FIG. 2, the amplifier circuit 30 and the directional coupler 40 are not illustrated. For example, part of a transmission signal amplified in the amplifier circuit 30, which is acquired from the directional coupler 40, is inputted to a terminal PAin illustrated in FIG. 2. Further, at the time of detecting the temperature of the amplifier circuit 30 using the temperature detection circuit 1, an enable signal is inputted to each of terminals PAen. Further, also at the time of detecting the power of a transmission signal outputted from the amplifier circuit 30, the enable signal is inputted to each of the terminals PAen. Further, a "Bias Circuit" illustrated in FIG. 2 is a circuit for supplying a bias current to a first transistor Q1, a second transistor Q2, a third transistor Q3, a fourth transistor Q4, and a fifth transistor Q5, which will be described below, during the time when the enable signal is inputted to the terminals PAen.

The temperature detection circuit 1 includes the first transistor Q1 and the second transistor Q2 that are of a bipolar type and form the current mirror circuit 10. For example, the first transistor Q1 and the second transistor Q2 are each a heterojunction bipolar transistor (HBT).

The first transistor Q1 and the second transistor Q2 form the current mirror circuit 10. Specifically, the current mirror circuit 10 is formed by connecting a base terminal of the first transistor Q1 and a base terminal of the second transistor Q2 and connecting the base terminal and a collector terminal of the first transistor Q1.

The temperature detection circuit 1 detects the temperature of the amplifier circuit 30 based on a temperature change of the first transistor Q1 and the second transistor Q2. To realize such temperature detection, an emitter terminal of one of the first transistor Q1 and the second transistor Q2 is connected to ground with a resistor R1 interposed therebetween, and an emitter terminal of the other of the first transistor Q1 and the second transistor Q2 is connected to the ground with no resistor interposed therebetween. Here, the emitter terminal of the first transistor Q1 is connected to the ground with no resistor interposed therebetween, and the emitter terminal of the second transistor Q2 is connected to the ground with the resistor R1 interposed therebetween.

When the temperature of the amplifier circuit 30 changes, the temperature of the current mirror circuit 10, that is to say the first transistor Q1 and the second transistor Q2, arranged close to the amplifier circuit 30 also changes in response to a temperature change of the amplifier circuit 30. In response to a temperature change of the first transistor Q1 and the second transistor Q2, a collector current of the second transistor Q2 changes, and by detecting a change in this collector current, it becomes possible to detect the temperature of the amplifier circuit 30. Here, the principle of temperature detection is described using FIG. 3.

Figure 3:
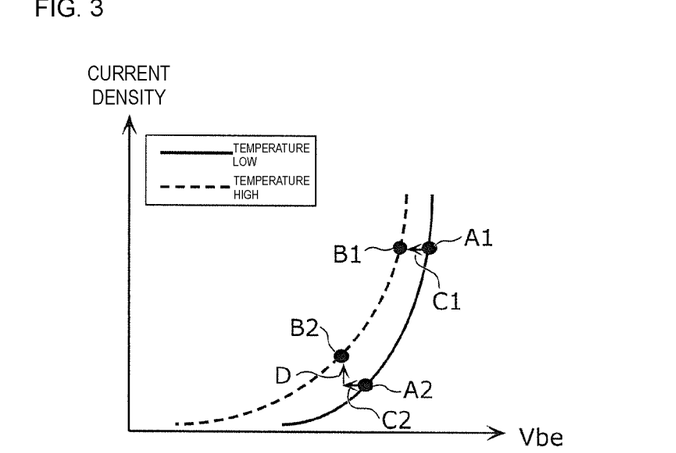
FIG. 3 is a graph for illustrating the principle of temperature detection.

FIG. 3 is a graph for illustrating the principle of temperature detection. Specifically, the horizontal axis represents the base-emitter voltage Vbe of the first transistor Q1 and the second transistor Q2, and the vertical axis represents the current density flowing into the collector terminal thereof. Further, the solid line denotes a relationship between the voltage Vbe and the current density when the temperature is low, and the dashed line denotes a relationship between the voltage Vbe and the current density when the temperature is higher than the temperature of the solid line. As the temperature increases, the pinch-off voltage decreases, and thus the relationship between the voltage Vbe and the current density changes between the case where the temperature is high and the case where the temperature is low, like the dashed line and the solid line illustrated in FIG. 3. A point A1 is an operating point of the first transistor Q1 when the temperature is low, and a point B1 is an operating point of the first transistor Q1 when the temperature is high. A point A2 is an operating point of the second transistor Q2 when the temperature is low, and a point B2 is an operating point of the second transistor Q2 when the temperature is high.

Here, as illustrated in FIG. 3, it is found that the operating point is different between the first transistor Q1 and the second transistor Q2. One reason for this is that because the emitter terminal of the second transistor Q2 is connected to the ground with the resistor R1 interposed therebetween, the voltage Vbe of the operating point of the second transistor Q2 becomes lower than the voltage Vbe of the operating point of the first transistor Q1.

When the temperature of the first transistor Q1 and the second transistor Q2 increases, the operating point of the first transistor Q1 moves from the point A1 to the point B1, and the voltage Vbe of the first transistor Q1 decreases by the amount denoted by an arrow C1 while keeping the current density flowing into the collector terminal of the first transistor Q1 constant. Because the first transistor Q1 and the second transistor Q2 form the current mirror circuit 10 and the base terminal of the first transistor Q1 and the base terminal of the second transistor Q2 are connected to each other, the voltage Vbe of the operating point of the second transistor Q2 also decreases by the same amount as denoted by the arrow C1 from that of the point A2 as illustrated by an arrow C2. However, the point resulted from the decrease in the voltage Vbe from that of the point A2 by the amount denoted by the arrow C2 due to the increase in the temperature of the second transistor Q2 does not exist on the graph illustrating the relationship between the voltage Vbe and the current density when the temperature is high, like the dashed line illustrated in FIG. 3. Because of this, in the second transistor Q2, the current density of the collector terminal increases by the amount denoted by an arrow D in such a way that the operating point of the second transistor Q2 falls on this graph. As described above, in response to a temperature change of the first transistor Q1 and the second transistor Q2, the collector current of the second transistor Q2 changes. That is to say, the current mirror circuit 10 serves as a circuit that converts the temperature change of the first transistor Q1 and the second transistor Q2 into the current. This enables to detect the temperature change of the first transistor Q1 and the second transistor Q2, that is to say the temperature change of the amplifier circuit 30, from the collector current of the second transistor Q2.

Note that even in the case where the emitter terminal of the first transistor Q1 is connected to the ground with the resistor R1 interposed therebetween and the emitter terminal of the second transistor Q2 is connected to the ground with no resistor interposed therebetween, the temperature change of the amplifier circuit 30 can be detected in a similar manner. This is described using FIG. 4.

Figure 4:
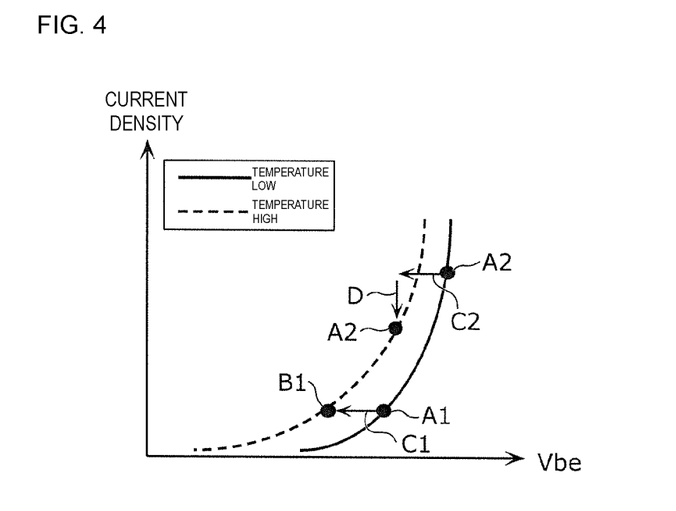
FIG. 4 is a graph for illustrating the principle of temperature detection.

FIG. 4 is a graph for illustrating the principle of temperature detection. In FIG. 4, the operating point is also different between the first transistor Q1 and the second transistor Q2. However, because the emitter terminal of the first transistor Q1 is connected to the ground with the resistor R1 interposed therebetween, the voltage Vbe of the operating point of the first transistor Q1 becomes lower than the voltage Vbe of the operating point of the second transistor Q2.

When the temperature of the first transistor Q1 and the second transistor Q2 increases, the operating point of the first transistor Q1 moves from the point A1 to the point B1, and the voltage Vbe of the first transistor Q1 decreases by the amount denoted by the arrow C1 while keeping the current density flowing into the collector terminal of the first transistor Q1 constant. The voltage Vbe of the operating point of the second transistor Q2 also decreases by the same amount as denoted by the arrow C1 from that of the point A2 as illustrated by an arrow C2. However, a point resulted from a decrease in the voltage Vbe from that of the point A2 by the amount denoted by the arrow C2 due to an increase in the temperature of the second transistor Q2 does not exist on the graph illustrating the relationship between the voltage Vbe and the current density when the temperature is high, like the dashed line illustrated in FIG. 4. Because of this, in the second transistor Q2, the current density of the collector terminal decreases by the amount denoted by the arrow D in such a way that the operating point of the second transistor Q2 falls on this graph. As described above, even in the case where the resistor R1 is connected to the emitter terminal of the first transistor Q1, in response to the temperature change of the first transistor Q1 and the second transistor Q2, the collector current of the second transistor Q2 changes, and this enables the detection of the temperature change of the amplifier circuit 30.

In order to detect a temperature in the end from the current (the collector current of the second transistor Q2) that has been converted from the temperature by the current mirror circuit 10, the temperature detection circuit 1 includes the detector circuit 20 connected to a collector terminal of the second transistor Q2 as illustrated in FIG. 2. The detector circuit 20 is a circuit that converts that current into a voltage. Specifically, the detector circuit 20 includes the third transistor Q3 whose base terminal is connected to the collector terminal of the second transistor Q2, the fourth transistor Q4 whose base terminal is connected to a collector terminal of the third transistor Q3, and the fifth transistor Q5 whose base terminal is connected to a collector terminal of the fourth transistor Q4. Each of the third transistor Q3 to the fifth transistor Q5 is of a bipolar type. The detector circuit 20 converts a current inputted to the base terminal of the third transistor Q3 into a voltage at an emitter terminal of the fifth transistor Q5 (output voltage of the detector circuit 20 to be outputted from the terminal Vout).

The output voltage of the detector circuit 20 that corresponds to the temperature of the amplifier circuit 30 and is outputted from the terminal Vout is described using an example where the temperature of the amplifier circuit 30 increases, that is to say the collector current of the second transistor Q2 increases, in the case where the resistor R1 is connected to the emitter terminal of the second transistor Q2.

When the temperature of the amplifier circuit 30 increases and the collector current of the second transistor Q2 increases, the base current flowing into the base terminal of the third transistor Q3, which is connected to the collector terminal of the second transistor Q2, decreases. When the base current of the third transistor Q3 decreases, the collector current of the third transistor Q3 also decreases. When the collector current of the third transistor Q3 decreases, the base current flowing into the base terminal of the fourth transistor Q4, which is connected to the collector terminal of the third transistor Q3, increases. When the base current of the fourth transistor Q4 increases, the collector current of the fourth transistor Q4 also increases. When the collector current of the fourth transistor Q4 increases, the collector voltage of the fourth transistor Q4 also increases. Here, because the fifth transistor Q5 is a transistor that functions as a buffer, the emitter voltage of the fifth transistor Q5 becomes approximately the same voltage as the collector voltage of the fourth transistor (specifically, the voltage that is lower than the collector voltage of the fourth transistor by the amount of the base-emitter voltage of the fifth transistor). Accordingly, the emitter voltage of the fifth transistor Q5 increases, and that is to say, the output voltage of the terminal Vout increases. As described above, as the temperature of the amplifier circuit 30 increases, the collector current of the second transistor Q2 increases, and the output voltage of the terminal Vout increases.

Figure 5:
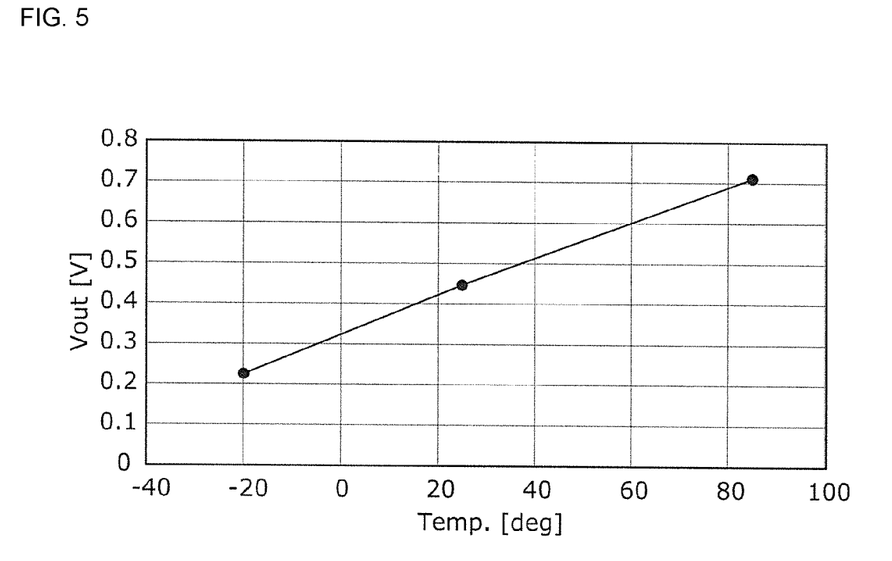
FIG. 5 is a graph illustrating a relationship between the temperature of an amplifier circuit and the output voltage of a detector circuit.

FIG. 5 is a graph illustrating a relationship between the temperature of the amplifier circuit 30 and the output voltage of the detector circuit 20. As described above, it is found that as the temperature of the amplifier circuit 30 increases, the output voltage of the terminal Vout increases.

Note that although a detailed description is omitted, in the case where the resistor R1 is connected to the emitter terminal of the first transistor Q1, as the temperature of the amplifier circuit 30 increases, the collector current of the second transistor Q2 decreases, and the output voltage of the terminal Vout decreases. Even in this case, although there is difference between the increase and the decrease in the output voltage when the temperature of the amplifier circuit 30 increases, the temperature of the amplifier circuit 30 corresponds to the output voltage outputted from the terminal Vout.

The detector circuit 20 is a circuit having no temperature dependency. Specifically, by configuring the detector circuit 20 as illustrated in FIG. 2, it becomes possible to make the output voltage of the terminal Vout less susceptible to the temperature even if the temperatures of the third transistor Q3, the fourth transistor Q4, and the fifth transistor Q5 change and the characteristics of these transistors change.

Further, for example, a change in the collector current of the second transistor Q2 in response to the temperature change of the amplifier circuit 30 is extremely small. For this, the temperature detection circuit 1 includes the detector circuit 20, and this enables to easily detect a change in the collector current of the second transistor Q2 (that is to say, a change in the temperature of the amplifier circuit 30). Specifically, as illustrated in FIG. 5, a temperature change of approximately 100 degrees is translated into a voltage change of about 0.5 V.

Further, as described above, in order to make the operating point of the first transistor Q1 and the operating point of the second transistor Q2 different from each other, the resistor R1 is connected to one of the emitter terminal of the first transistor Q1 and the emitter terminal of the second transistor Q2. Because of this, the flow of the collector current of the transistor to which the resistor R1 is connected is hindered by the resistor R1. For this, one of the first transistor Q1 and the second transistor Q2, which is connected to the ground with the resistor R1 interposed therebetween, is made to have a larger size than the other of the first transistor Q1 and the second transistor Q2 (specifically, has a larger emitter area). This enables the current whose flow is hindered by connecting the resistor R1 for making the operating points different from each other to flow easier by the amount of an increased emitter area.

Further, for example, although the temperature detection circuit 1 detects the temperature of the amplifier circuit 30 to ensure the reliability of the amplifier circuit 30, it is preferable that the temperature detection circuit 1 further includes a function to detect the power of a transmission signal outputted from the amplifier circuit 30. This is because it becomes possible to reduce the size and the cost compared with the case where a circuit for temperature detection and a circuit for power detection are separately provided. Although it is not illustrated in FIG. 2, the temperature detection circuit 1 may switch between the state where the temperature detection is performed and the state where the power detection is performed by using, for example, a switch or the like. Specifically, at the time of performing the power detection, the switch is switched in such a way that part of a transmission signal outputted from the amplifier circuit 30 is inputted to the terminal PAin. Further, at the time of performing the temperature detection, the switch is switched in such a way that part of a transmission signal outputted from the amplifier circuit 30 is not inputted to the terminal PAin.

Note that in recent years, radio frequency modules, each of which is compatible with a plurality of frequency bands, and the like are being developed, and thus the frequency of a transmission signal outputted from the amplifier circuit 30 is not fixed in some cases. Because of this, it is desirable that the detector circuit 20 suppresses the effects of the frequency at the time of detecting the power of a transmission signal. For example, in the case where the output power of the terminal Pout is the same for a plurality of transmission signals that have different frequencies, it is preferable that the output voltage outputted from the terminal Vout is also the same for the plurality of transmission signals that have different frequencies. That is to say, it is preferable that the output voltage does not change depending on the frequency. As described above, in order to add not only the temperature detection function but also the power detection function to the detector circuit 20, it is preferable to suppress effects of the frequency.

In view of the above, the emitter terminal of the third transistor Q3 and the emitter terminal of the fourth transistor Q4 are connected to the ground with a circuit, in which a resistor and a capacitor are connected in parallel, interposed therebetween. Specifically, the emitter terminal of the third transistor Q3 is connected to the ground with a circuit in which a resistor R2 and a capacitor C1 are connected in parallel interposed therebetween, and the emitter terminal of the fourth transistor Q4 is connected to the ground with a circuit in which a resistor R3 and a capacitor C2 are connected in parallel interposed therebetween. The resistor R2 is provided for adjusting the bias of the third transistor Q3, and the capacitor C1 is provided for grounding the emitter terminal of the third transistor Q3 AC-wise. The resistor R3 is provided for adjusting the bias of the fourth transistor Q4, and the capacitor C2 is provided for grounding the emitter terminal of the fourth transistor Q4 AC-wise. The relationship between the output voltage of the terminal Vout and the output power of the terminal Pout can be adjusted for each frequency by inserting the resistors R2 and R3 and the capacitors C1 and C2 whose parameters are adjusted. Accordingly, because the detector circuit 20 can detect the power of a transmission signal while suppressing the effects of the frequency, it becomes possible to perform both the temperature detection and the power detection.

Note that in order to further suppress the effects of the frequency, the base terminal of the third transistor Q3 and the base terminal of the fourth transistor Q4 may be connected with a circuit, in which a resistor and a capacitor are connected in series, interposed therebetween. This is described using FIG. 6 to FIG. 7B.

Figure 6:
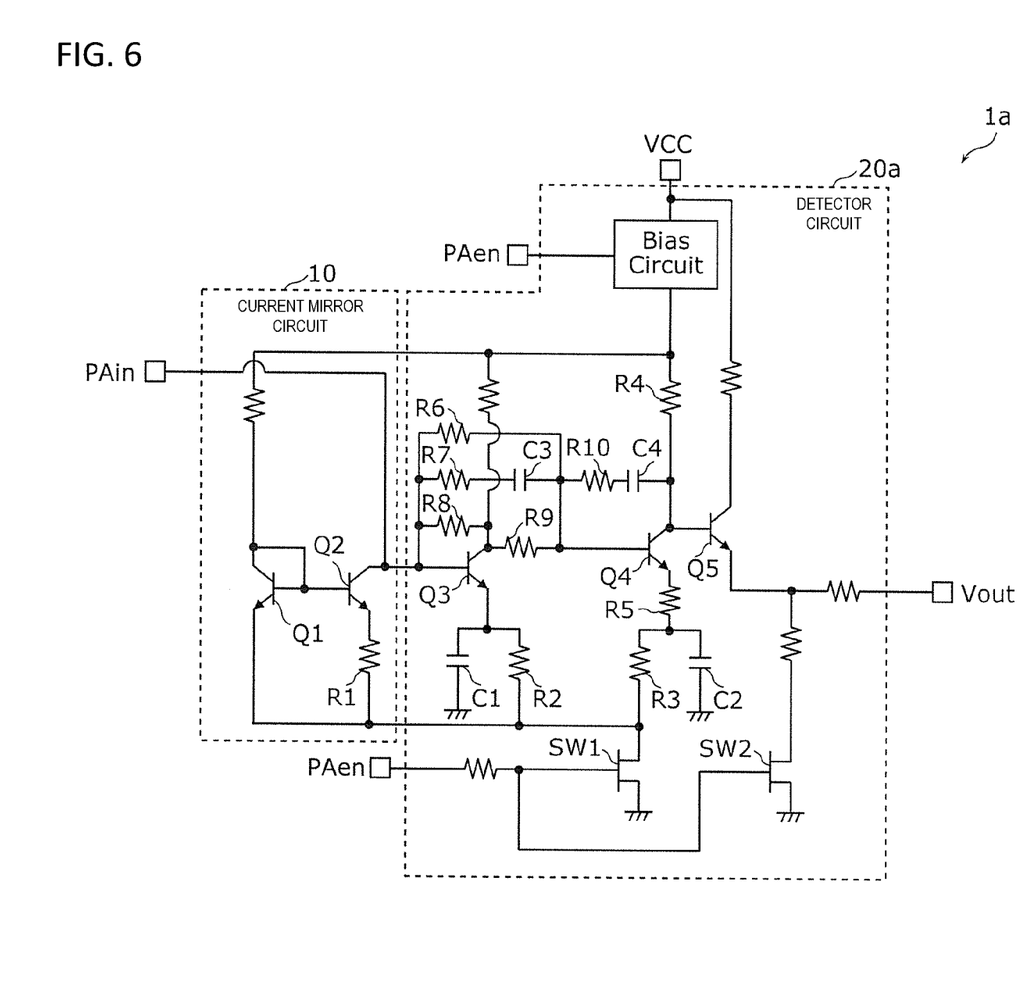
FIG. 6 is a circuit configuration diagram illustrating an example of a temperature detection circuit according to a modified example of the embodiment.
Figure 7A:
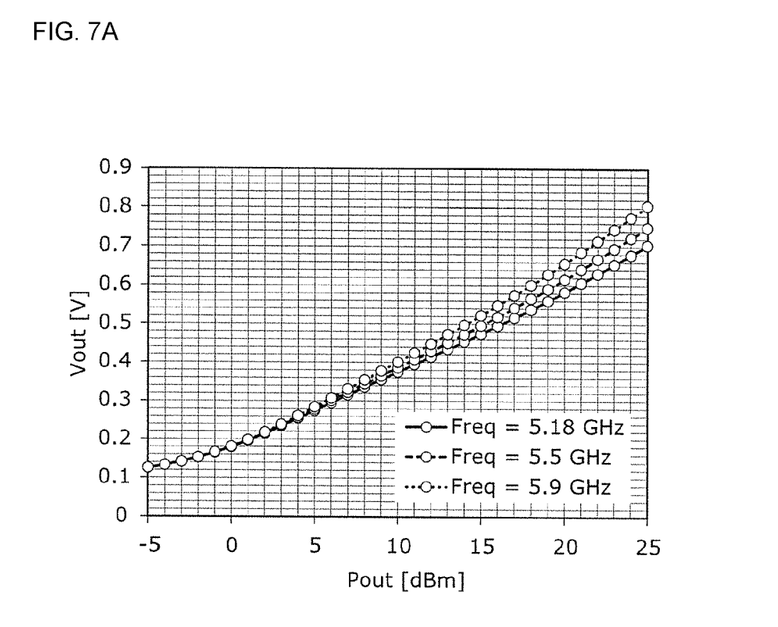
FIG. 7A is a graph illustrating a relationship between the transmission voltage and the output power of a detector circuit in the embodiment.

FIG. 6 is a circuit configuration diagram illustrating an example of a temperature detection circuit 1a according to a modified example of the embodiment.

The temperature detection circuit 1a is different from the temperature detection circuit 1 in including a detector circuit 20a instead of the detector circuit 20. Further, the detector circuit 20a is different from the detector circuit 20 in further including resistors R6 to R10 and capacitors C3 and C4. The remaining points are the same as the temperature detection circuit 1, and thus the descriptions thereof are omitted.

Note that as illustrated in FIG. 6, the base terminal of the third transistor Q3 and the base terminal of the fourth transistor Q4 are connected to each other with a circuit, in which the resistor R7 and the capacitor C3 are connected in series, interposed therebetween. The base terminal of the third transistor Q3 and the base terminal of the fourth transistor Q4 are connected to each other with the resistor R6 interposed therebetween, and a circuit, in which the resistor R7 and the capacitor C3 are connected in series, and the resistor R6 are connected in parallel. The base terminal and the collector terminal of the third transistor Q3 are connected to each other with the resistor R8 interposed therebetween. The collector terminal of the third transistor Q3 and the base terminal of the fourth transistor Q4 are connected to each other with the resistor R9 interposed therebetween. The base terminal of the fourth transistor Q4 and the base terminal of the fifth transistor Q5 are connected to each other with a circuit, in which the resistor R10 and the capacitor C4 are connected in series, interposed therebetween. Note that the resistors R6, R8, R9, and R10 and the capacitor C4 may not need to be provided so long as at least the resistor R7 and the capacitor C3 are provided.

At this time, by inserting the resistor R6 in between the base terminal of the third transistor Q3 and the base terminal of the fourth transistor Q4, it becomes possible to adjust the output voltage outputted from the terminal Vout in response to a signal inputted to the terminal PAin according to the resistance value of the adjusted resistor R6. For example, in the case where the size of a signal inputted to the terminal PAin is small, the detection accuracy of the detector circuit 20a decreases, and the output voltage outputted from the terminal Vout is likely to be lower than a voltage corresponding to the signal inputted to the terminal PAin. Even in such case, the insertion of the resistor R6 whose resistance value is adjusted increases the output voltage outputted from the terminal Vout and facilitates outputting of a voltage close to the voltage corresponding to the signal inputted to the terminal PAin. That is to say, the insertion of the resistor R6 enables to output an accurate output voltage from the terminal Vout even in the case where a signal inputted to the terminal PAin decreases. Accordingly, it becomes possible to facilitate the improvement of the detection accuracy of the detector circuit 20a.

A signal inputted to the terminal PAin is supplied to the base terminal of the fourth transistor Q4 via the resistors R6 to R9 and the capacitor C3. When a signal inputted to the terminal PAin increases, the amount of a current flowing through the fourth transistor Q4 increases according to parameters of the resistors R6 to R9 and the capacitor C3. As this signal increases, the current flowing into the base terminal of the fifth transistor Q5 also increases, and the output voltage of the terminal Vout increases. That is to say, the relationship between the output voltage of the terminal Vout and the output power of the terminal Pout can be adjusted for each frequency by inserting the resistors R6 to R9 and the capacitor C3 whose parameters are adjusted.

FIG. 7A is a graph illustrating a relationship between the transmission power and the output voltage of the detector circuit 20 in the embodiment. FIG. 7A is a graph illustrating a relationship between the transmission power and the output voltage of the detector circuit 20 in the case where the resistors R6 to R9 and the capacitor C3 are not provided. For example, the solid line denotes the foregoing relationship at a transmission signal frequency of 5.18 GHz, the dashed line denotes the foregoing relationship at a transmission signal frequency of 5.5 GHz, and the dotted line denotes the foregoing relationship at a transmission signal frequency of 5.9 GHz.

As described above, the relationship between the output voltage of the terminal Vout and the output power of the terminal Pout can be adjusted for each frequency by inserting the resistors R2 and R3 and the capacitors C1 and C2. By adjusting parameters of the resistors R2 and R3 and the capacitors C1 and C2, it is possible to cause an adjustment of parallel displacement of all the voltage values of a curve depicting the forgoing relationship for each frequency. However, it is difficult to adjust the inclination of the foregoing relationship. Because of this, as illustrated in FIG. 7A, by causing a parallel displacement of the curve depicting the foregoing relationship, it becomes possible to make the output voltage equal at a specific output power (for example, an output power of −5 dBm) for all the frequencies. However, it is difficult to adjust the foregoing inclination for each frequency, and a difference in the output voltages for different frequencies increases as the output power increases.

Figure 7B:
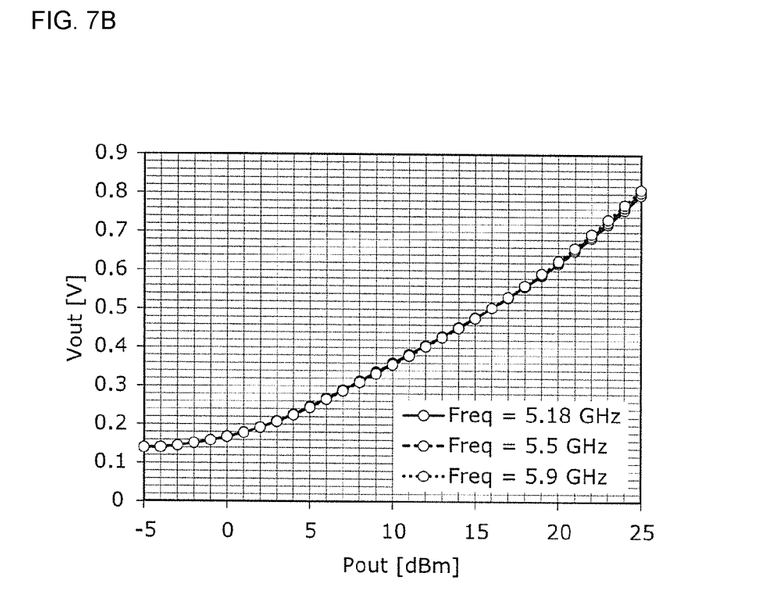
FIG. 7B is a graph illustrating a relationship between the transmission voltage and the output power of a detector circuit in a modified example of the embodiment.

FIG. 7B is a graph illustrating a relationship between the transmission power and the output voltage of the detector circuit 20a in the modified example of the embodiment. FIG. 7B is a graph illustrating a relationship between the transmission power and the output voltage of the detector circuit 20a in the case where the resistors R6 to R9 and the capacitor C3 are provided. For example, the solid line denotes the foregoing relationship at a transmission signal frequency of 5.18 GHz, the dashed line denotes the foregoing relationship at a transmission signal frequency of 5.5 GHz, and the dotted line denotes the foregoing relationship at a transmission signal frequency of 5.9 GHz.

It is found that by inserting the resistors R6 to R9 and the capacitor C3 whose parameters are adjusted, it becomes possible to adjust the inclination of the foregoing relationship at each frequency, and as the output power increases, the output voltage similarly changes at each frequency. As described above, it becomes possible to further suppress the effects of the frequency by at least connecting the base terminal of the third transistor Q3 and the base terminal of the fourth transistor Q4 with the circuit, in which the resistor R7 and the capacitor C3 are connected in series, interposed therebetween.

Note that also with regard to the resistor R4 connected to the collector terminal of the fourth transistor Q4 and the resistor R5 connected to the emitter terminal of the fourth transistor Q4, by inserting the resistor R4 and the resistor R5 after the adjustment of the resistance values thereof, the foregoing inclination can be adjusted.

Further, as illustrated in FIG. 6, it becomes possible to further improve the detection accuracy of the detector circuit 20a by connecting the base terminal of the fourth transistor Q4 and the base terminal of the fifth transistor Q5 with the circuit, in which the resistor R10 and the capacitor C4 are connected in series, interposed therebetween, in addition to connecting the base terminal of the third transistor Q3 and the base terminal of the fourth transistor Q4 with the circuit, in which the resistor R7 and the capacitor C3 are connected in series, interposed therebetween.

A signal inputted to the terminal PAin is supplied to the base terminal of the fifth transistor Q5 via the circuit in which the resistor R7 and the capacitor C3 are connected in series and the circuit in which the resistor R10 and the capacitor C4 are connected in series. When a signal inputted to the terminal PAin increases, the amount of a current flowing through the fifth transistor Q5 increases according to the parameters of the resistors R6 to R10 and the capacitors C3 and C4. As this signal increases, the current flowing into the base terminal of the fifth transistor Q5 also increases, and the output voltage of the terminal Vout increases. For example, in the case where the size of a signal inputted to the terminal PAin is large, the detection accuracy of the detector circuit 20a decreases due to an effect of a saturation region of a bipolar transistor included in the detector circuit 20a, and the output voltage outputted from the terminal Vout is likely to be lower than a voltage corresponding to the signal inputted to the terminal PAin. For this, even in such case, by inserting the resistor R10 whose resistance value is adjusted and the capacitor C4 whose capacitance value is adjusted, it becomes possible to increase the output voltage outputted from the terminal Vout and facilitate outputting of a voltage close to the voltage corresponding to the signal inputted to the terminal PAin. That is to say, even in the case where a signal inputted to the terminal PAin increases, the insertion of the resistor R7 and the capacitor C3 enables to output an accurate output voltage from the terminal Vout and expand the dynamic range. Accordingly, it becomes possible to facilitate the improvement of the detection accuracy of the detector circuit 20a.

Further, it is preferable to reduce power consumption when the temperature detection circuit 1, 1a is not performing one of the temperature detection and the power detection. Therefore, the emitter terminal of the third transistor Q3 and the emitter terminal of the fourth transistor Q4 are connected to the ground with a switch SW1 interposed therebetween. Specifically, the switch SW1 is connected in series between the resistors R2 and R3 and the ground. Further, the emitter terminal of the fifth transistor Q5 is connected to the ground with a switch SW2 interposed therebetween. For example, the switches SW1 and SW2 are field effect transistors (FETs). For example, the switches SW1 and SW2 are turned to the electrically continuous state by inputting an enable signal into the terminal PAen, and the emitter terminals of the third transistor Q3, the fourth transistor Q4, and the fifth transistor Q5 are connected to the ground. That is to say, when the temperature detection circuit 1, 1a is not performing one of the temperature detection and the power detection, it becomes possible to prevent the temperature detection circuit 1, 1a from functioning by turning the switches SW1 and SW2 to the electrically discontinuous state, and this enables the reduction of power consumption.

As described above, according to the temperature detection circuits 1 and 1a, it becomes possible to detect the temperature of the amplifier circuit 30 based on the temperature change of the first transistor Q1 and the second transistor Q2. Specifically, it becomes possible to realize the detection of the temperature of the amplifier circuit 30 by connecting the emitter terminal of one of the first transistor Q1 and the second transistor Q2 to the ground with the resistor R1 interposed therebetween and connecting the emitter terminal of the other of the first transistor Q1 and the second transistor Q2 to the ground with no resistor interposed therebetween. More specifically, the resistor R1 enables to make the operating points of the respective transistors different from each other, and this enables to convert the temperature change of the first transistor Q1 and the second transistor Q2 into the current. By detecting this current, it becomes possible to detect the temperature of the amplifier circuit 30.

OTHER EMBODIMENTS

The temperature detection circuits 1 and 1a according to the present disclosure have been described above using the embodiments. However, the present disclosure is not limited to the foregoing embodiments. Other embodiments realized by combining optional constituent elements of the foregoing embodiments, modified examples obtained by applying various modifications apparent to those skilled in the art to the foregoing embodiments without departing the scope of the present disclosure, and various devices including the temperature detection circuit 1 or 1a according to the present disclosure may also be included in the present disclosure.

For example, in the foregoing embodiments, a signal outputted from the amplifier circuit 30 is acquired using the directional coupler 40 and inputted to the temperature detection circuit 1 or 1a. However, the configuration is not limited thereto. For example, a signal outputted from the amplifier circuit 30 may be directly acquired without using the directional coupler 40.

Further, for example, in the foregoing embodiments, the temperature detection circuits 1 and 1a include the detector circuits 20 and 20a, respectively. However, the configuration is not limited thereto. For example, the temperature detection circuits 1 and 1a may not need to include the detector circuits 20 and 20a, respectively. It becomes possible to easily detect a change in the collector current of the second transistor Q2 because the temperature detection circuits 1 and 1a include the detector circuits 20 and 20a, respectively. However, even without including the detector circuits 20 and 20a, it is possible to detect a change in the collector current of the second transistor Q2.

Further, for example, in the foregoing embodiments, in order to illustrate the close-distance arrangement of the current mirror circuit 10 and the amplifier circuit 30, it is described that the distance between the current mirror circuit 10 and the amplifier circuit 30 is smaller than the distance between the detector circuit 20, 20a and the amplifier circuit 30. However, the distance between the current mirror circuit 10 and the amplifier circuit 30 may be larger than the distance between the detector circuit 20, 20a and the amplifier circuit 30, provided that the current mirror circuit 10 and amplifier circuit 30 are arranged in close distance in such a way that the temperature of the amplifier circuit 30 can transmit to the current mirror circuit 10.

Further, for example, in the foregoing embodiments, the emitter terminal of the third transistor Q3 and the emitter terminal of the fourth transistor Q4 are connected to the ground with the switch SW1 interposed therebetween. However, the configuration is not limited thereto, and the emitter terminal of the third transistor Q3 and the emitter terminal of the fourth transistor Q4 may be connected to the ground without the switch SW1 interposed therebetween.

Further, for example, the emitter terminal of the third transistor Q3 and the emitter terminal of the fourth transistor Q4 are connected to the ground with the circuit, in which a resistor and a capacitor are connected in parallel, interposed therebetween. However, the configuration is not limited thereto, and the emitter terminal of the third transistor Q3 and the emitter terminal of the fourth transistor Q4 may be connected to the ground without such circuit interposed therebetween.

Further, for example, the resistor to be used in the temperature detection circuit 1, 1a may be a variable resistor, and the capacitor may be a variable capacitor.

The present disclosure can be used in a circuit that detects the power of a signal outputted from an amplifier circuit.

1, 1a Temperature detection circuit
10 Current mirror circuit
20, 20a Detector circuit
30 Amplifier circuit
40 Directional coupler
C1, C2, C3, C4 Capacitor
Q1 First transistor
Q2 Second transistor
Q3 Third transistor
Q4 Fourth transistor
Q5 Fifth transistor
R1, R2, R3, R4, R5, R6, R7, R8, R9, R10 Resistor
SW1, SW2 Switch

The invention claimed is:

1. A temperature detection circuit for detecting a temperature of an amplifier circuit, the temperature detection circuit comprising:
a first transistor of a bipolar type; and
a second transistor of the bipolar type, wherein
the first transistor and the second transistor form a current mirror circuit, and
the temperature of the amplifier circuit is detected based on a temperature change of the first transistor and the second transistor,
a detector circuit connected to a collector terminal of the second transistor, wherein
the current mirror circuit converts a temperature change of the first transistor and the second transistor into a current, and
the detector circuit converts the current into a voltage,
wherein the detector circuit includes:
a third transistor of the bipolar type, wherein a base terminal of the third transistor is connected to the collector terminal of the second transistor;
a fourth transistor of the bipolar type, wherein a base terminal of the fourth transistor is connected to a collector terminal of the third transistor; and
a fifth transistor of the bipolar type, wherein a base terminal of the fifth transistor is connected to a collector terminal of the fourth transistor, and
the detector circuit converts the current inputted to the base terminal of the third transistor into a voltage at an emitter terminal of the fifth transistor.

2. The temperature detection circuit according to claim 1, wherein an emitter terminal of one of the first transistor or the second transistor is connected to ground with a resistor interposed therebetween, and an emitter terminal of the other of the first transistor or the second transistor is connected to the ground with no resistor interposed therebetween.

3. The temperature detection circuit according to claim 2, wherein
a base terminal of the first transistor is connected to a base terminal of the second transistor and the a base terminal of the second transistor is connected to a collector terminal of the first transistor.

4. The temperature detection circuit according to claim 2, wherein
the one of the first transistor or the second transistor connected to the ground with the resistor interposed therebetween has a larger emitter area than the other of the first transistor and the second transistor.

5. The temperature detection circuit according to claim 4, further comprising:
a detector circuit connected to a collector terminal of the second transistor, wherein
the current mirror circuit converts a temperature change of the first transistor and the second transistor into a current, and
the detector circuit converts the current into a voltage.

6. The temperature detection circuit according to claim 2, further comprising:
a detector circuit connected to a collector terminal of the second transistor, wherein
the current mirror circuit converts a temperature change of the first transistor and the second transistor into a current, and
the detector circuit converts the current into a voltage.

7. The temperature detection circuit according to claim 1, wherein
the detector circuit has no temperature dependency.

8. The temperature detection circuit according to claim 7, wherein
the detector circuit and the amplifier circuit are formed in a same chip, and
a distance between the current mirror circuit and the amplifier circuit is smaller than a distance between the detector circuit and the amplifier circuit.

9. The temperature detection circuit according to claim 1, wherein
the detector circuit and the amplifier circuit are formed in a same chip, and
a distance between the current mirror circuit and the amplifier circuit is smaller than a distance between the detector circuit and the amplifier circuit.

10. The temperature detection circuit according to claim 1, wherein
the detector circuit and the amplifier circuit are formed in a same chip, and
the current mirror circuit is arranged closer to the amplifier circuit than the detector circuit.

11. The temperature detection circuit according to claim 1, wherein
the current mirror circuit, the detector circuit and the amplifier circuit are formed in a same chip.

12. The temperature detection circuit according to claim 1, wherein
an emitter terminal of the third transistor and an emitter terminal of the fourth transistor are connected to the ground with a switch interposed therebetween.

13. The temperature detection circuit according to claim 12, wherein
an emitter terminal of the third transistor and an emitter terminal of the fourth transistor are connected to the ground with a circuit interposed therebetween, wherein the circuit comprises a resistor and a capacitor connected in parallel to one another.

14. The temperature detection circuit according to claim 12, wherein
the base terminal of the third transistor and the base terminal of the fourth transistor are connected to one another with a circuit interposed therebetween, wherein the circuit comprises a resistor and a capacitor connected in series to one another.

15. The temperature detection circuit according to claim 1, wherein
an emitter terminal of the third transistor and an emitter terminal of the fourth transistor are connected to the ground with a circuit interposed therebetween, wherein the circuit comprises a resistor and a capacitor connected in parallel to one another.

16. The temperature detection circuit according to claim 1, wherein
the base terminal of the third transistor and the base terminal of the fourth transistor are connected to one another with a circuit interposed therebetween, wherein the circuit comprises a resistor and a capacitor connected in series to one another.

* * * * *